(12) United States Patent
Becker et al.

(10) Patent No.: US 10,438,924 B2
(45) Date of Patent: Oct. 8, 2019

(54) METHOD FOR COHESIVELY CONNECTING A FIRST COMPONENT OF A POWER SEMICONDUCTOR MODULE TO A SECOND COMPONENT OF A POWER SEMICONDUCTOR MODULE

(71) Applicant: DANFOSS SILICON POWER GMBH, Flensburg (DE)

(72) Inventors: Martin Becker, Kiel (DE); Ronald Eisele, Surendorf (DE); Frank Osterwald, Kiel (DE); Jacek Rudzki, Kiel (DE); Holger Ulrich, Eisendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 281 days.

(21) Appl. No.: 15/581,010

(22) Filed: Apr. 28, 2017

(65) Prior Publication Data

US 2017/0317051 A1   Nov. 2, 2017

(30) Foreign Application Priority Data

Apr. 29, 2016   (DE) .................. 10 2016 108 000

(51) Int. Cl.
*H01L 23/00* (2006.01)
*B23K 20/02* (2006.01)
*B23K 101/40* (2006.01)

(52) U.S. Cl.
CPC ............ *H01L 24/83* (2013.01); *B23K 20/023* (2013.01); *H01L 24/29* (2013.01); *H01L 24/32* (2013.01);
(Continued)

(58) Field of Classification Search
CPC .......... H01L 24/29; H01L 24/32; H01L 24/83
See application file for complete search history.

(56) References Cited

U.S. PATENT DOCUMENTS

| | | | | |
|---|---|---|---|---|
| 4,810,672 A | * | 3/1989 | Schwarzbauer | .... H01L 23/4828 148/33.4 |
| 4,856,185 A | * | 8/1989 | Baumgartner | ...... H01L 23/4828 29/840 |

(Continued)

FOREIGN PATENT DOCUMENTS

| | | |
|---|---|---|
| DE | 10 2009 022 660 B3 | 9/2010 |
| DE | 10 2009 020 733 A1 | 11/2010 |

(Continued)

*Primary Examiner* — Anthony J Zimmer
*Assistant Examiner* — Ricardo D Morales
(74) *Attorney, Agent, or Firm* — McCormick, Paulding & Huber LLP

(57) ABSTRACT

A method for cohesively connecting a first component of a power semiconductor module to a second component of a power semiconductor module by sintering, the method comprising the steps of: applying a layer of unsintered sinter material to a predetermined bonding surface of the first component, arranging the second component on the surface layer of unsintered sinter material, attaching the second component to the first component by applying pressure and/or temperature on a locally delimited partial area within the predetermined bonding surface, processing the first and/or second component and/or other components of the power semiconductor module, and complete-area sintering of the sinter material.

20 Claims, 3 Drawing Sheets

(52) U.S. Cl.
CPC ............... *B23K 2101/40* (2018.08); *H01L 2224/29019* (2013.01); *H01L 2224/29078* (2013.01); *H01L 2224/29082* (2013.01); *H01L 2224/3201* (2013.01); *H01L 2224/32505* (2013.01); *H01L 2224/8384* (2013.01); *H01L 2224/83191* (2013.01); *H01L 2224/83203* (2013.01)

(56) References Cited

U.S. PATENT DOCUMENTS

| | | | | |
|---|---|---|---|---|
| 6,195,454 | B1* | 2/2001 | Yazawa | H05K 13/0812 |
| | | | | 382/151 |
| 8,835,299 | B2* | 9/2014 | Speckels | H01L 24/32 |
| | | | | 438/455 |
| 2013/0221526 | A1* | 8/2013 | Lange | H01L 21/50 |
| | | | | 257/750 |
| 2015/0171054 | A1* | 6/2015 | Yamayose | H01L 24/32 |
| | | | | 257/773 |

FOREIGN PATENT DOCUMENTS

| | | |
|---|---|---|
| DE | 10 2011 115 886 A1 | 4/2013 |
| DE | 10 2012 221 396 A1 | 6/2014 |
| DE | 10 2014 105 462 A1 | 10/2014 |
| WO | 2010/091660 A2 | 8/2010 |

\* cited by examiner

METHOD FOR COHESIVELY CONNECTING A FIRST COMPONENT OF A POWER SEMICONDUCTOR MODULE TO A SECOND COMPONENT OF A POWER SEMICONDUCTOR MODULE

CROSS REFERENCE TO RELATED APPLICATION

This application claims foreign priority benefits under U.S.C. § 119 to German Patent Application No. DE102016108000.4 filed on Apr. 29, 2016, the content of which is incorporated by reference in its entirety.

TECHNICAL FIELD

The invention relates to a method for cohesively connecting a first component of a power semiconductor module to a second component of a power semiconductor module by sintering.

BACKGROUND

In order to develop long-lived and robust power semiconductor modules, stringent thermal and electrical requirements are made specifically of the upper and lower bonding locations of the semiconductor, that is to say the top side and underside thereof. The underside of the semiconductor is usually contacted with a solder connection or else with a sintered or diffusion-soldered connection.

The top side of the semiconductor has as standard a metallization or metal layer that is optimized for the bonding process of thick aluminium wires. Despite the expansion-intensive metallization layers on the top side and underside of the semiconductor, the semiconductors are nevertheless becoming thinner and thinner in order to reduce the electrical losses. Power semiconductors having a total thickness of only approximately 70 µm are currently available on the market.

In order to increase the reliability of the top-side contacts on the chip, it is known to cohesively sinter the metal bodies directly on the wafer or to attach them and sinter them later or, during the placement process, to position and attach them on the individual chip and to sinter them later in one process step with the sintering of the chip on the substrate; cf., inter alia, DE 10 2011 115 886 A1.

Attaching the metal bodies or else attaching chips on the substrate serves for maintaining the position of the metal bodies or the chips during the further process steps. It is only with the complete-area sintering step that a fixed, complete-area cohesive connection is produced which has the desired properties of high thermal and electrical conductivity, and also high mechanical strength extending into a high temperature range.

For the attaching itself, various possibilities are known: For example, chips are positioned on sinter paste that has not yet dried.

Also known are methods with the aid of volatile materials (e.g. alcohol) which are applied to the sinter paste and which volatilize to the greatest possible extent during sintering.

The applicant has also disclosed a method published with WO 2010/091660 A2 and referred to as "Pick & Fix": in this case, the attaching is carried out by precompaction of the silver suspension without producing continuous sintering. However, the precompaction already leads to adhesion without impairing the later sinterability.

What is disadvantageous about the known methods is the use of different connection materials, that is to say e.g. adhesive and sinter paste or sinter paste and alcohol, which is linked to a higher, in part complex, workload and higher costs resulting from the use, application and processing of a plurality of connection materials.

In particular, the method referred to as "Pick & Fix" involves the risk of a very fine line between the complete-area precompaction (for attaching) and the incipient complete-area sintering. The process window for attaching is therefore very small and has to be complied with carefully.

Other methods for creating high-temperature and temperature-resistant connections of electronic components are known from DE 10 2009 020 733 A1, DE 102009 022 660 B3, DE 10 2012 221 396 A1 and DE 10 2014 105 462 A1.

SUMMARY

The object of the invention, therefore, is to provide a method which makes it possible to cover the semiconductor chips with a metal body to be sintered, simply and in a manner involving little work expenditure.

The basic concept of the invention is that of attaching a first component of a power semiconductor module to a second component of a power semiconductor module by a sintering being formed in a locally very delimited manner.

For the further illustration of the invention it is assumed that the first component is a semiconductor and the second component is a metal body. In other cases, however, the first component can be a substrate and the second component can be a semiconductor.

Outside this locally delimited location, the sinter paste remains unchanged to the greatest possible extent, that is to say that, in particular, it exhibits virtually no appreciable precompaction or even signs of sintering of the metallic particles with one another or with the surfaces of the chip or of the metal body that are to be connected.

The local sintering is achieved in the Pick & Place process by virtue of the fact that one or a plurality of small-area sintering stamps exert the necessary pressure and the necessary application of temperature on the metal body and the underlying sinter paste, locally compact the latter and thus achieve a local fixing of metal body and chip metallization.

It is advantageous for this method if the metal body is plastically deformable to the effect that it adapts to the underlying sinter paste in the region of the application of pressure in the course of the compaction. This local compaction is not conceivable e.g. between two solid and scarcely plastically deformable bodies (e.g. chip and ceramic substrate).

A further possibility for achieving a local compaction of the sintering layer below the metal body is to use varying layer thicknesses of the sintering layer prior to sintering. It is advantageous to realize a local increase in the layer thickness in the dry state (prior to sintering), e.g. by small sinter paste deposits additionally being applied to the normal sinter powder layer. This method makes it possible furthermore to employ hydrostatic sintering pressure, which is also exerted over the metal body.

Since the metal body is less compliant, the location having the increased silver powder content is compressed to a particularly great extent and generates more pressure locally, which enables the attachment of metal body on e.g. chip surface.

The invention accordingly provides a method for cohesively connecting a first component of a power semiconductor module to a second component of a power semiconductor module by sintering, the method comprising the steps of: applying a layer of unsintered sinter material to a predetermined bonding surface of the first component, arranging the second component on the surface layer of unsintered sinter material, attaching the second component to the first component by applying pressure and/or temperature on a locally delimited partial area within the predetermined bonding surface, processing the first and/or second component and/or other components of the power semiconductor module, and sintering of the complete area of the sinter material.

In particular, the method is configured in such a way that the attaching is carried out by means of a stamp which applies pressure and/or temperature and where the the base area of which stamp corresponds to the partial area.

Alternatively, the attaching within the locally delimited partial area is realized by applying a further layer of the unsintered sinter material on the first and/or the second component within the layer of unsintered sinter material applied on the predetermined bonding surface within the locally delimited partial area, wherein the attaching is carried out by means of a stamp which applies pressure and/or temperature and where the base area of which stamp corresponds at least to the locally delimited partial area, by processing the sinter material application within the partial area.

In this embodiment, it is particularly preferably provided that the stamp base area of the stamp corresponds at least to the predetermined bonding surface.

In particular, the further layer of unsintered sinter material is applied only after the drying of the layer of unsintered sinter material applied on the predetermined bonding surface.

With further preference, the first component is a semiconductor and the second component is a metal body. Alternatively, the first component is a substrate and the second component is a semiconductor.

Processing the first and/or second component and/or other components of the power semiconductor module comprises in particular moving the first and second components from one location to another.

BRIEF DESCRIPTION OF THE DRAWINGS

The invention is explained in greater detail on the basis of exemplary embodiments configured in a particularly preferred manner and illustrated in the drawings, in which.

DETAILED DESCRIPTION

Figure 1:
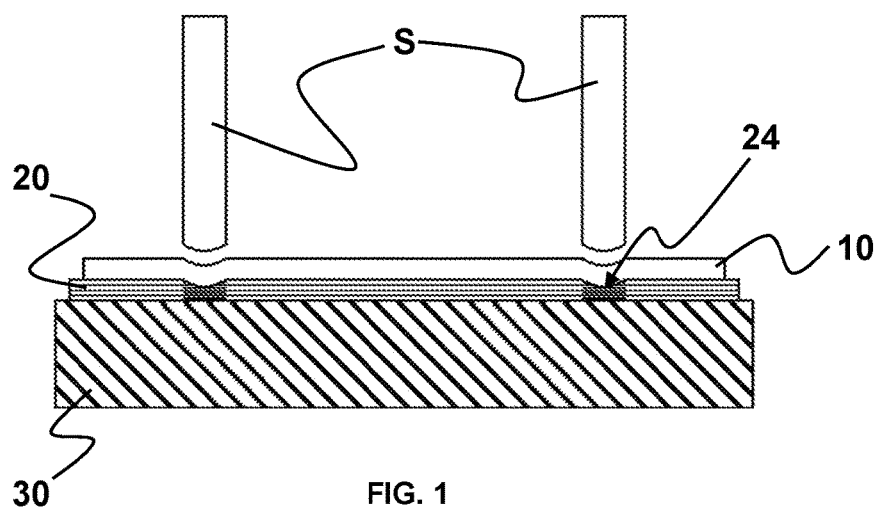
FIG. 1 shows a first exemplary embodiment of a plastically deformable first component of a power semiconductor module that is attached to a second component.

FIG. 1 shows a first exemplary embodiment of a plastically deformable first component of a power semiconductor module that is attached to a second component. This example relates, in particular, to the attaching of a plastically deformable metal body to a plastically non-deformable semiconductor chip. FIG. 1 shows a first component 10 of a power semiconductor module, which first component is attached to a second component 30 of a power semiconductor module. Between the first component 10 and the second component 30, a sinter material 20 is arranged on a predetermined bonding surface, preferably over the complete area, which sinter material, after the application of pressure and temperature imparted by the stamp S within a locally delimited partial area 24, is at least precompacted (in accordance with "Pick & Fix" methods) or alternatively is already completely sintered.

FIG. 1 shows the first component 10 attached to the second component 30 after the process for attaching, but before the final connection of the two components to one another by complete-area sintering.

If the final connection of the two components is finally performed by complete-area sintering, a complete-area sintered layer results in this exemplary embodiment, wherein the partial region 24 substantially does not differ from the rest of the bonding region in terms of its properties after complete-area sintering has been carried out.

Figure 2:
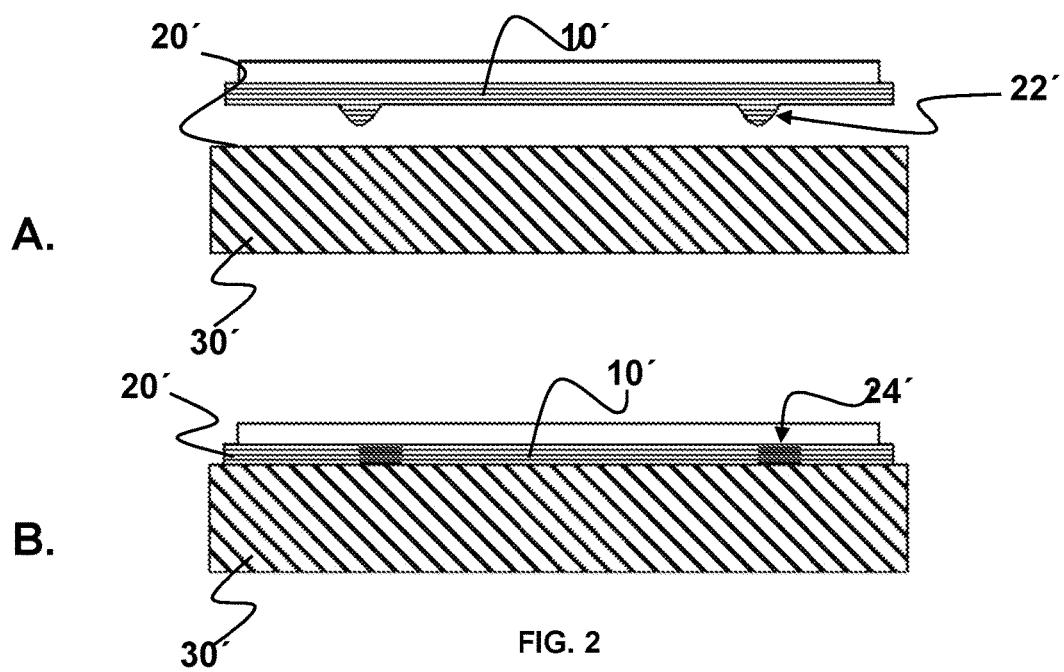
FIG. 2 shows a second exemplary embodiment of a substantially plastically non-deformable first component before attaching to a second component of a power semiconductor module (A), and after attaching to the second component of a power semiconductor module (B)

FIG. 2 shows second exemplary embodiment of a substantially plastically non-deformable first component before attaching to a second component of a power semiconductor module (A), and after attaching to the second component of a power semiconductor module (B).

In contrast to the example shown in FIG. 1, this embodiment is particularly suitable for components which are only slightly plastically deformable or are not plastically deformable at all. This example relates, in particular, to the attaching of a plastically non-deformable semiconductor chip to a plastically non-deformable substrate.

For this purpose, a layer of an unsintered sinter material 20' is applied to a first component 10', wherein the first component 10' is substantially plastically non-deformable, e.g. a semiconductor chip. In addition to the layer of unsintered sinter material 20' of uniform thickness, an additional second layer of unsintered sinter material 22' is applied to the sinter layer 20' (or alternatively to the second component 30') (see FIG. 2A).

If pressure and temperature are then applied to the first component 10' at least in the partial region in which unsintered sinter material 22' was additionally applied, but preferably over the complete area, firstly the sinter material is precompacted or completely sintered in the partial region 24', such that the first component 10' is attached to the second component 30', without complete-area sintering occurring. FIG. 2B thus shows the state after attaching has been carried out, and before the further processing and complete-area sintering.

If the final connection of the two components 10', 30' is finally performed by complete-area sintering, a complete-area sintered layer results in this second exemplary embodiment, wherein the partial region 24' substantially differs from the rest of the bonding region in terms of its properties after complete-area sintering has been carried out, in that the partial region 24' has a greater compaction than the rest of the region. It is therefore appropriate in this configuration to bring about the attachment only by means of a small application of an additional layer 22' of unsintered sinter material and only by precompaction, but not complete-area sintering of the partial region.

Figure 3:
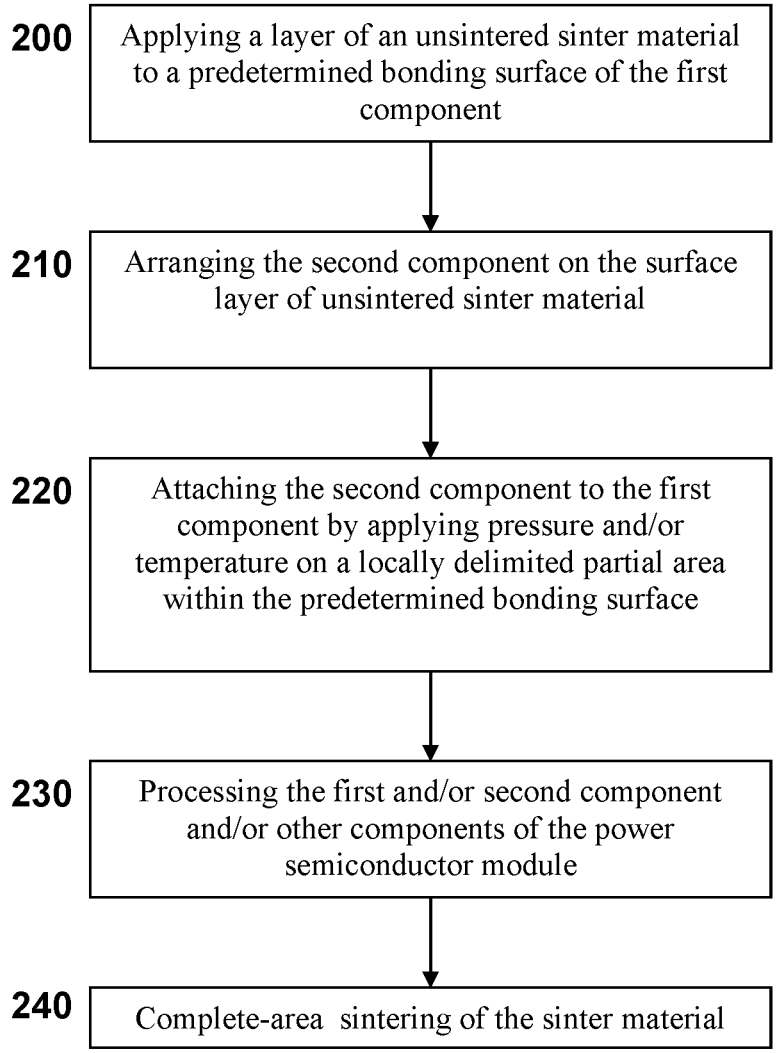
FIG. 3 shows a flow diagram of the general method sequence according to the invention.

FIG. 3 shows a flow diagram of the general method sequence according to the invention.

In order to carry out the method for cohesively connecting a first component of a power semiconductor module to a second component of a power semiconductor module by sintering, firstly in step 200 a layer of an unsintered sinter material is applied to a predetermined bonding surface of the first component.

In step 210 the second component is arranged on the surface layer of unsintered sinter material and afterwards, in step 220, the second component is attached to the first component by applying pressure and/or temperature on a locally delimited partial area within the predetermined bonding surface by means of sintering this locally delimited region.

Furthermore, the first and/or second component and/or other components of the power semiconductor module can be processed, i.e. treated or transferred, in step 230 until complete-area sintering of the sinter material is finally carried out in step 240.

Figure 4:
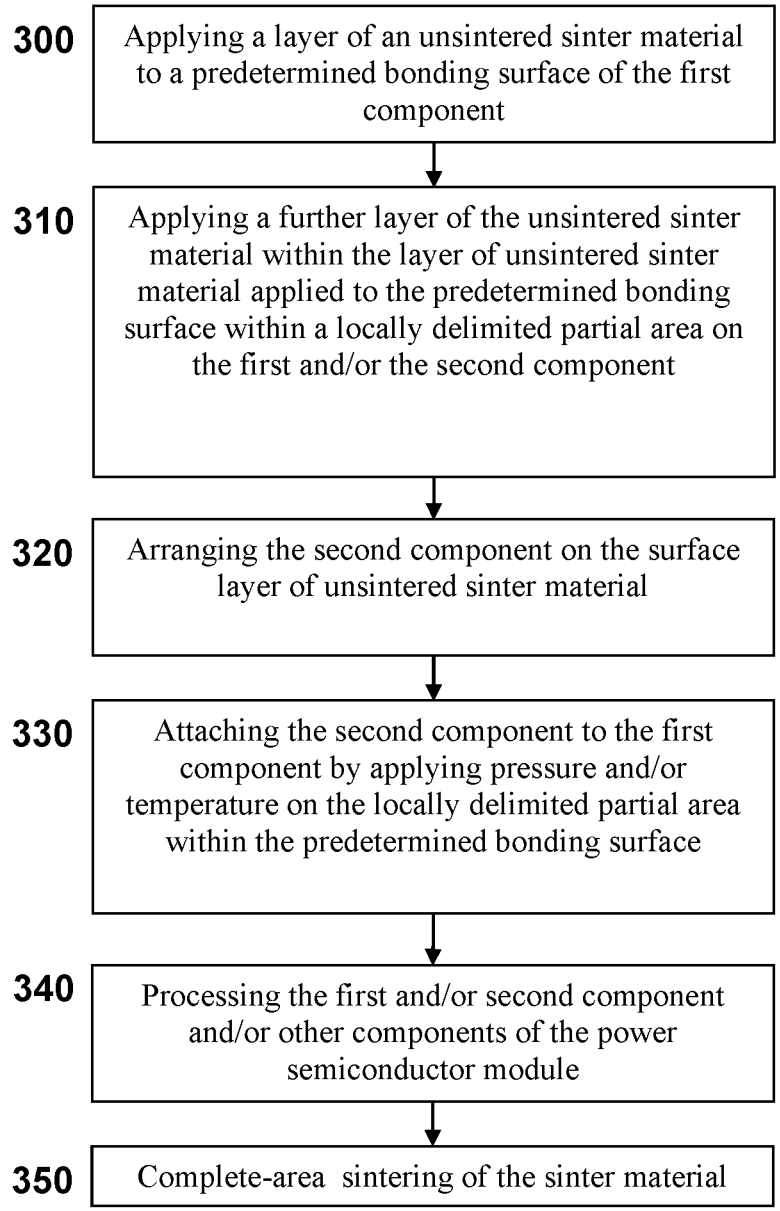
FIG. 4 shows a flow diagram of the method sequence according to an exemplary embodiment configured in a particularly preferred manner.

Finally, FIG. 4 shows a flow diagram of the method sequence according to an exemplary embodiment configured in a particularly preferred manner.

As illustrated previously in FIG. 3, here as well in order to carry out the method for cohesively connecting a first component of a power semiconductor module to a second component of a power semiconductor module by sintering, firstly in step 300 a layer of an unsintered sinter material is applied to a predetermined bonding surface of the first component.

In a departure from FIG. 3, however, then in FIG. 4, step 310, a further layer of the unsintered sinter material is applied within the layer of unsintered sinter material applied on the predetermined bonding surface within a locally delimited partial area on the first and/or the second component (also see FIG. 2).

In step 320 the second component is arranged on the surface layer of unsintered sinter material and the further layer arranged between the latter and the second component. In the subsequent step 330 the second component is then attached to the first component by applying pressure and/or temperature on a locally delimited partial area within the predetermined bonding surface by means of sintering this locally delimited region.

Furthermore, the first and/or second component and/or other components of the power semiconductor module can be processed, i.e. treated or transferred, in step 340 until complete-area sintering of the sinter material is finally carried out in step 350.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for cohesively connecting a first component of a power semiconductor module to a second component of a power semiconductor module by sintering, the method comprising the steps of:
    applying a layer of unsintered sinter material to a predetermined bonding surface of the first component,
    arranging the second component on the surface layer of unsintered sinter material such that the unsintered sinter material contacts the second component at a second component bonding area,
    attaching the second component to the first component by applying pressure and/or temperature on a locally delimited partial area within the predetermined bonding surface,
    processing the first and/or second component and/or other components of the power semiconductor module, and
    sintering of the complete area of the sinter material,
    wherein the locally delimited partial area is smaller than the second component bonding area.

2. The method according to claim 1, wherein the attaching is carried out by means of a stamp which applies pressure and/or temperature and where the base area of which stamp corresponds to the partial area.

3. The method according to claim 1, further comprising applying a further layer of unsintered sinter material to the layer of unsintered sinter material applied on the predetermined bonding surface within the locally delimited partial area on the first component, wherein the attaching is carried out by means of a stamp which applies pressure and/or temperature and where the base area of which stamp corresponds at least to the locally delimited partial area, by processing the sinter material application within the partial area.

4. The method according to claim 3, wherein the stamp base area of the stamp corresponds at least to the predetermined bonding surface.

5. The method according to claim 3, wherein the further layer of unsintered sinter material is applied after the drying of the layer of unsintered sinter material applied on the predetermined bonding surface.

6. The method according to claim 1, wherein the first component is a semiconductor and the second component is a metal body or the first component is a substrate and the second component is a semiconductor.

7. The method according to claim 1, wherein processing the first and/or second component and/or other components of the power semiconductor module comprises moving the first and second components.

8. The method according to claim 4, wherein the further layer of unsintered sinter material is applied after the drying of the layer of unsintered sinter material applied on the predetermined bonding surface.

9. The method according to claim 2, wherein the first component is a semiconductor and the second component is a metal body or the first component is a substrate and the second component is a semiconductor.

10. The method according to claim 3, wherein the first component is a semiconductor and the second component is a metal body or the first component is a substrate and the second component is a semiconductor.

11. The method according to claim 4, wherein the first component is a semiconductor and the second component is a metal body or the first component is a substrate and the second component is a semiconductor.

12. The method according to claim 5, wherein the first component is a semiconductor and the second component is a metal body or the first component is a substrate and the second component is a semiconductor.

13. The method according to claim 2, wherein processing the first and/or second component and/or other components of the power semiconductor module comprises moving the first and second components.

14. The method according to claim 3, wherein processing the first and/or second component and/or other components of the power semiconductor module comprises moving the first and second components.

15. The method according to claim 4, wherein processing the first and/or second component and/or other components of the power semiconductor module comprises moving the first and second components.

16. The method according to claim 5, wherein processing the first and/or second component and/or other components of the power semiconductor module comprises moving the first and second components.

17. The method according to claim 6, wherein processing the first and/or second component and/or other components of the power semiconductor module comprises moving the first and second components.

18. The method according to claim 3, further comprising applying a second further layer of unsintered sinter material to a second predetermined bonding surface of the second component within a second locally delimited partial area within the second predetermined bonding surface, wherein the attaching is carried out by means of a stamp which applies pressure and/or temperature and where the base area of which stamp corresponds at least to the locally delimited partial area and the second locally delimited partial area, by processing the sinter material application within the partial areas.

19. A method for cohesively connecting a first component of a power semiconductor module to a second component of a power semiconductor module by sintering, the method comprising the steps of:
  applying a layer of unsintered sinter material to a first predetermined bonding surface of the first component,
  applying a further layer of the unsintered sinter material to a second predetermined bonding surface of the second component within a locally delimited partial area within the second predetermined bonding surface,
  arranging the second component on the surface layer of unsintered sinter material on the first component such that the unsintered sinter material contacts the second component at a second component bonding area,
  attaching the second component to the first component by applying pressure and/or temperature on the locally delimited partial area within the second predetermined bonding surface,
  processing the first and/or second component and/or other components of the power semiconductor module, and
  sintering of the complete area of the sinter material,
  wherein the locally delimited partial area is smaller than the second component bonding area.

20. A method for cohesively connecting a first component of a power semiconductor module to a second component of a power semiconductor module by sintering, the method comprising the steps of:
  applying a layer of unsintered sinter material to a predetermined bonding surface of the first component,
  arranging the second component on the surface layer of unsintered sinter material,
  attaching the second component to the first component by applying pressure and/or temperature on a locally delimited partial area within the predetermined bonding surface,
  processing the first and/or second component and/or other components of the power semiconductor module, and
  sintering of the complete area of the sinter material,
  wherein the sintering of the complete area of the sinter material is performed after the attaching the second component to the first component by applying pressure and/or temperature on the locally delimited partial area within the predetermined bonding surface.

* * * * *